United States Patent
Chen et al.

(10) Patent No.: US 10,546,964 B2
(45) Date of Patent: Jan. 28, 2020

(54) MOLYBDENUM SELENIDE SUBLAYERS WITH CONTROLLED THICKNESS IN SOLAR CELLS AND METHODS FOR FORMING THE SAME

(71) Applicants: Shih-Wei Chen, Kaohsiung (TW); Wen-Chin Lee, Baoshan Township (TW); Wen-Tsai Yen, Caotun Township (TW); Chung-Hsien Wu, Luzhu Township (TW); Kuan-Chu Chen, Tainan (TW)

(72) Inventors: Shih-Wei Chen, Kaohsiung (TW); Wen-Chin Lee, Baoshan Township (TW); Wen-Tsai Yen, Caotun Township (TW); Chung-Hsien Wu, Luzhu Township (TW); Kuan-Chu Chen, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/677,361

(22) Filed: Nov. 15, 2012

(65) Prior Publication Data
US 2014/0130856 A1    May 15, 2014

(51) Int. Cl.
*H01L 31/032*       (2006.01)
*H01L 31/0749*      (2012.01)
(Continued)

(52) U.S. Cl.
CPC .. *H01L 31/0322* (2013.01); *H01L 31/022425* (2013.01); *H01L 31/03923* (2013.01);
(Continued)

(58) Field of Classification Search
CPC ....... Y02E 10/541; Y02E 10/52; Y02E 10/50; H01L 31/0322; H01L 31/02568;
(Continued)

(56) References Cited

U.S. PATENT DOCUMENTS 6,310,281 B1 * 10/2001 Wendt et al. ................. 136/256
7,998,762 B1 *  8/2011 Lee .................... H01L 21/67167
                                                 257/40
(Continued)

FOREIGN PATENT DOCUMENTS

CN       104396020 A      3/2013
JP      2009289955 A     12/2009

OTHER PUBLICATIONS

P.M.P. Salomé, J. Malaquias, P.A. Fernandes and A.F. da Cunha, "Mo bi-layer for thin film photovoltaics revisited", Oct. 7, 2011.*
(Continued)

*Primary Examiner* — Mayla Gonzalez Ramos
(74) *Attorney, Agent, or Firm* — Duane Morris LLP

(57) ABSTRACT

A solar cell with a molybdenum back electrode layer and a molybdenum selenide ohmic contact layer over the molybdenum back electrode, is provided. The molybdenum selenide layer includes an accurately controlled thickness. A distinct interface exists between the molybdenum back electrode layer and the molybdenum silicide layer. The molybdenum silicide layer is produced by forming a molybdenum layer or a molybdenum nitride layer or a molybdenum oxide layer over an initially formed molybdenum layer such that an interface exists between the two layers. A selenization and sulfurization process is carried out to selectively convert the molybdenum-containing layer to molybdenum selenide but not the original molybdenum back electrode layer which remains as a molybdenum layer.

16 Claims, 2 Drawing Sheets

(51) Int. Cl.
*H01L 31/0392* (2006.01)
*H01L 31/0224* (2006.01)

(52) U.S. Cl.
CPC ........ *H01L 31/0749* (2013.01); *Y02E 10/541* (2013.01); *Y02P 70/521* (2015.11)

(58) Field of Classification Search
CPC ................. H01L 31/0749; H01L 31/18; H01L 31/03923; H01L 31/0272; H01L 31/0392; H01L 31/03925; H01L 31/206; H01L 21/02568; H01L 31/022425; Y02P 70/521
USPC .................................................. 136/243–265
See application file for complete search history.

(56) References Cited

U.S. PATENT DOCUMENTS

| | | | | |
|---|---|---|---|---|
| 8,582,105 | B1* | 10/2013 | Yang ................. | H01L 21/02491 136/262 |
| 2009/0020157 | A1* | 1/2009 | Krasnov ......... | H01L 31/022425 136/256 |
| 2009/0130796 | A1* | 5/2009 | Taunier et al. ................. | 438/94 |
| 2010/0300512 | A1* | 12/2010 | Auvray ........... | H01L 31/022425 136/252 |
| 2011/0097841 | A1* | 4/2011 | Krasnov et al. ................. | 438/98 |
| 2011/0277819 | A1* | 11/2011 | Scheulov ..................... | 136/246 |
| 2012/0180870 | A1* | 7/2012 | Yamamoto .......... | H01L 31/0322 136/262 |
| 2013/0109126 | A1* | 5/2013 | Van Duren et al. ............ | 438/71 |
| 2013/0284252 | A1* | 10/2013 | Krasnov ......... | H01L 31/022425 136/256 |

OTHER PUBLICATIONS

T. Wada, N. Koharb, S. Nishiwaki, T. Negami, "Characterization of the Cu(In,Ga)Se2/Mo interface in CIGS solar cells", 2001, pp. 118-122.*

Vasudha Guntur, "Molybdenum Nitride Films in the Back Contact Structure of Flexible Substrate CdTe Solar Cells", Jan. 1, 2011.*

L. Kaupmees, M. Altosaar, O. Volobujeva, T. Raadik, M. Grossberg, M. Danilson, E.Mellikov, and P. Barvinschi, "Isothermal and Two-Temperature Zone Selenization of Mo Layers", Oct. 4, 2011, pp. 1-11.*

Ankush R Halbe, "Characterization of Microstructural and Chemical Features in Cu—In—Ga—Se—S-Based Thin-Film Solar Cells", 2006, pp. 1-79.*

Machine Translation of JP2009-289955, Aoki et al., Published Dec. 10, 2009. Retrieved from https://worldwide.espacenet.com on Oct. 3, 2016.*

U.S. Appl. No. 13/689,091, filed Nov. 29, 2012.

Duchatelet, A. et al., "Effect of a Thermal Oxydation Pre-Treatment on Mo To Control the Growth and Formation of MoSe2 Layers for CIGS Solar Cells", 25th European Photovoltaic Solar Energy Conference and Exhibition/5th World Conference on Photovoltaic Energy Conversion, Sep. 2010, Valencia, Spain, pp. 3379-3381.

* cited by examiner

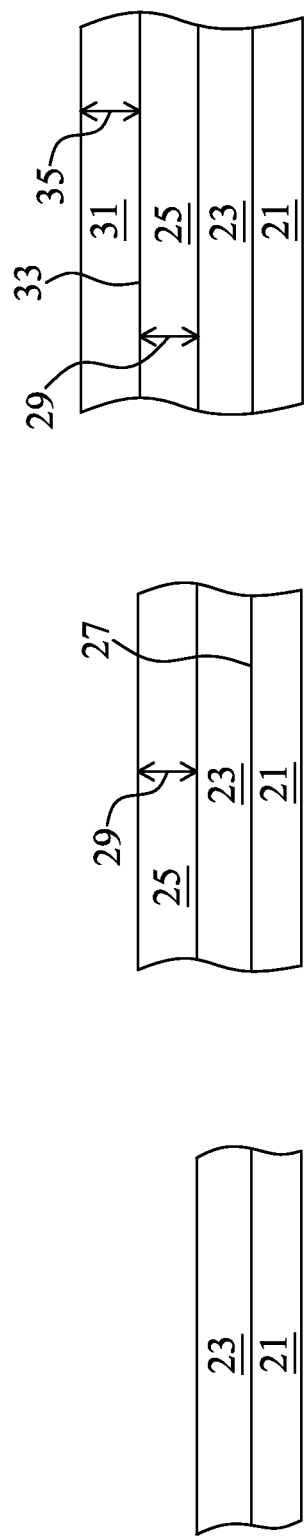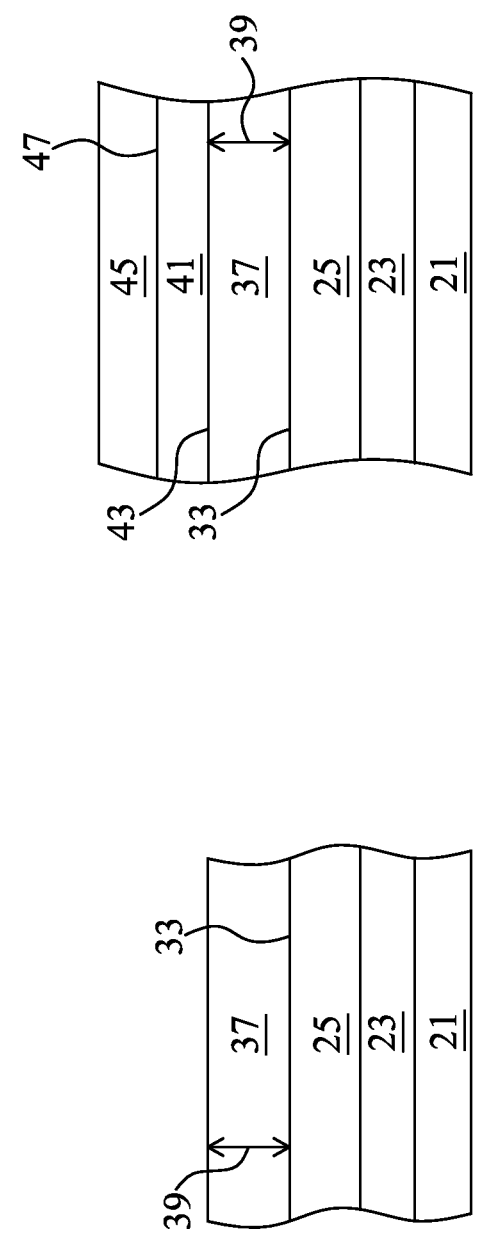

MOLYBDENUM SELENIDE SUBLAYERS WITH CONTROLLED THICKNESS IN SOLAR CELLS AND METHODS FOR FORMING THE SAME

TECHNICAL FIELD

The disclosure relates most generally to solar cell devices and methods and systems for forming the same. More particularly, the disclosure relates to methods and systems for controlling thickness of molybdenum selenide layers used to provide contact to back electrodes in solar cells.

BACKGROUND

Solar cells are photovoltaic components for direct generation of electrical current from sunlight. Due to the growing demand for clean sources of energy, the manufacture of solar cells has expanded dramatically in recent years and continues to expand.

Various types of solar cells exist. Solar cells include absorber layers that absorb photons from sunlight and convert the sunlight to electrical energy. One such absorber layer is a CIGS ($Cu(In,Ga)Se_2$) absorber layer, but other absorber layers are used in other solar cells. The absorber layer and other material layers used in solar cells are formed using various deposition processes that deposit layers of material over a substrate. A molybdenum, Mo, layer is commonly used as the back electrode layer formed either directly on or over the substrate. A molybdenum selenide, $MoSe_2$ layer is often formed over the Mo back electrode and used to establish ohmic contact between the Mo back electrode and the other layers of the solar cell such as the absorber layer. It is important but difficult to control the thickness of the molybdenum selenide layer formed over the molybdenum back contact layer. More particularly, it is difficult to control the thickness of the $MoSe_2$ layer formed using the selenization processes used to introduce selenium to the Mo layer to convert the Mo film to an Mo—Se material. It is difficult to control the degree of selenization and the amount of Mo material converted to $MoSe_2$. When the thickness of the $MoSe_2$ films is too great, higher sheet resistance results and device performance is degraded. Furthermore, thick $MoSe_2$ films also cause adhesion problems between the CIGS or other absorber layer and the underlying Mo back electrode layer.

It would therefore be desirable to form molybdenum selenide layers with accurately controlled thicknesses.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

FIGS. 2A-2E are each cross-sectional views and together illustrate a sequence of processing operations used to form a solar cell according to the disclosure.

DETAILED DESCRIPTION

Figure 1:
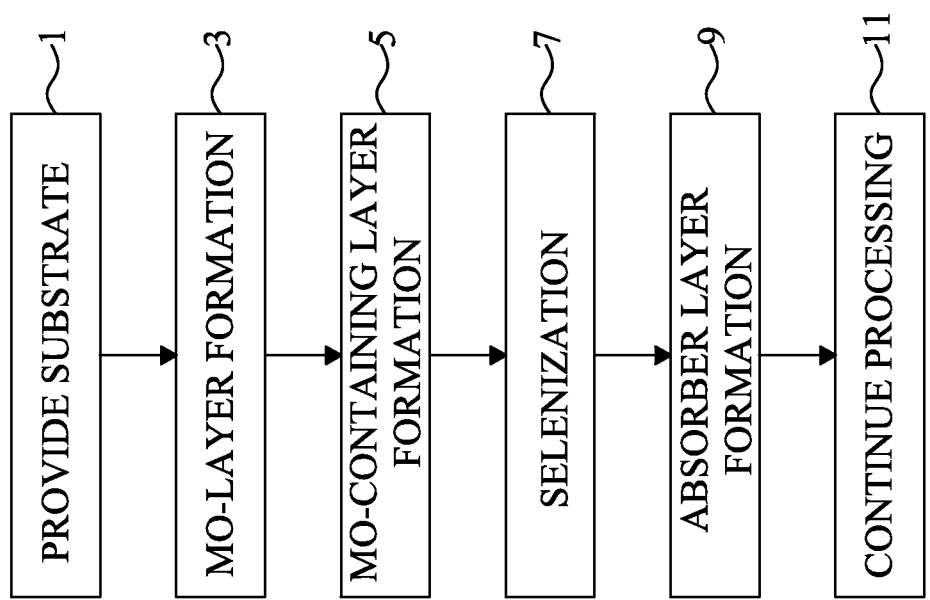
FIG. 1 is a flow chart illustrating steps of a method according to an embodiment of the disclosure.

The flow chart of FIG. 1 generally presents a sequence of processing operations used to form a solar cell with a molybdenum selenide layer with controlled thickness, over a molybdenum back contact layer. Further details of each of the processing steps represented in FIG. 1 are provided in conjunction with the discussion of FIGS. 2A-2E and FIG. 3.

Referring to FIG. 1, at step 1, a solar cell substrate is provided. At step 3, a molybdenum layer is formed over the substrate. The molybdenum layer may be formed directly on the substrate or over an oxide layer and/or a buffer layer formed over the substrate. At step 5, a molybdenum-containing layer is formed over the molybdenum layer. A distinct interface is interposed between the molybdenum layer and the molybdenum-containing layer. The molybdenum-containing layer may include additives such as oxygen or nitrogen, or both oxygen and nitrogen. At step 7, a selenization process takes place to introduce selenium to the molybdenum-containing layer and converts the molybdenum-containing layer, but not the molybdenum layer, to a $MoSe_2$ layer or other MoSe layer. In some embodiments, the selenization process is followed by or carried out simultaneously with a sulfurization process. At step 9, an absorber layer is formed over the Mo—Se layer and at step 11, processing is continued and additional layers are formed over the solar cell to produce a complete solar cell.

FIG. 2A is a cross-sectional view showing a first step in a method for forming a solar cell according to the disclosure. Substrate 21 is a solar cell substrate and is formed of various suitable materials used as solar cell substrates in the solar cell manufacturing industry. In one embodiment, substrate 21 is glass. Other substrates are used in other embodiments. Material 23 is disposed on substrate 21. Material 23 is an optional layer and in some embodiments, material 23 is not present. In some embodiments, material 23 is a barrier material. In other embodiments, material 23 is a silicon layer. In other embodiments, material 23 is a silicon oxide material. In still other embodiments, material 23 is a composite layer including one or more of the previously described embodiments for material 23.

FIG. 2B shows molybdenum, Mo, layer 25 disposed over substrate 21. More particularly, Mo layer 25 is disposed on material 23 which is disposed on substrate 1, but it should be understood that material 23 is not present in all embodiments and in some embodiments, Mo layer 25 is disposed directly on surface 27 of substrate 21. Various methods are used to form Mo layer 25 in various embodiments. In one embodiment, Mo layer 25 is formed using a sputtering operation. The sputtering operation is carried out with a power density of 2 $W/cm^2$ to 20 $W/cm^2$ in one embodiment, but other power densities are used in other embodiments. In some embodiments, the sputter conditions include a pressure of 2 millitorr to 10 millitorr, but other pressures are used in other embodiments. In some sputtering embodiments, Mo layer 25 is formed using a sputter deposition temperature within the range of about 25° C. to about 150° C., but other suitable temperatures are used in other embodiments. Other film formation/deposition methods are used to form Mo layer 25 in other embodiments. Mo layer 25 includes a thickness 29 that ranges from about 150 nm to about 1000 nm in various embodiments, but other thicknesses are used in other embodiments.

Now turning to FIG. 2C, Mo-containing layer 31 is formed over Mo layer 25. Distinct interface 33 is formed between Mo layer 25 and Mo-containing layer 31. Various methods are used to form Mo-containing layer 31. In one embodiment, Mo-containing layer 31 is formed by sputter deposition and the sputter deposition conditions include a power density of about 2 $W/cm^2$ to about 20 $W/cm^2$, a working pressure of about 2 millitorr to about 10 millitorr and a sputter deposition temperature of about 25° C. to about 150° C. in some embodiments, but other sputtering conditions are used in other embodiments. In other embodiments, deposition techniques other than sputtering are used to form Mo-containing layer 31. In one embodiment, Mo layer 25 and Mo-containing layer 31 are formed in the same deposition system both by sputter deposition and in one such embodiment, the sputtering operation used to form Mo layer 25 is terminated and deposition is stopped for at least one second and then the deposition process for forming Mo-containing layer 31 is then carried out. The time delay between the two sputtering operation ranges from 1 second to many minutes, in various embodiments. In another embodiment in which Mo-layer 25 and Mo-containing layer 31 are both formed in the same sputter deposition chamber, Mo-layer 25 is formed using one cathode, i.e. one Mo-containing source target and Mo-containing layer 31 is formed using another cathode, i.e. another Mo-containing source target. According to this embodiment, the sputtering operation involves switching from one cathode used to form Mo layer 25, to another cathode used to form Mo-containing layer 31 after the termination of the process used to from Mo layer 25. Other techniques for forming Mo-containing layer 31 in a separate formation operation than used for Mo layer 25, are used in other embodiments.

In some embodiments, Mo-containing layer 31 contains substantially only molybdenum. In other embodiments, Mo-containing layer 31 includes oxygen. In some embodiments, Mo-containing layer 31 includes nitrogen therein and in still other embodiments, Mo-containing layer 31 includes both nitrogen and oxygen therein. Other additives are used in still other embodiments. Applicants have found that the presence of oxygen, nitrogen or other suitable additives serve as barriers to mitigate Se diffusion in subsequent selenization processes as will be discussed below. According to one embodiment, a sputter deposition operation that sputters molybdenum from a sputter target is carried out in an environment that includes reactive oxygen gas or reactive nitrogen gas or both. According to such a sputter deposition embodiment used to produce the Mo-containing film 31 including oxygen and/or nitrogen, an applied power of 2 W/cm$^2$ to about 20 W/cm$^2$ may be used, a working pressure of about 2 millitorr to about 10 millitorr may be used and a sputter temperature ranging from about 25° C. to about 150° C. may be used, but other sputter deposition conditions are used in other embodiments.

In another embodiment, oxygen and/or nitrogen is incorporated into Mo-containing layer 31 by first forming Mo-containing layer 31 by sputtering or other means, then heating in an oxygen and/or nitrogen environment to incorporate oxygen and/or nitrogen into Mo-containing layer 31. Other methods are used to incorporate oxygen, nitrogen or other additives, into Mo-containing layer 31, in other embodiments. In one embodiment, Mo-containing layer 31 is pure Mo. In another embodiment, Mo-containing layer 31 is a molybdenum oxide such as $MoO_2$, $MoO_3$, $MO_4O_{11}$ or various combinations of molybdenum oxides or amorphous non-stoichiometric molybdenum oxides. In another embodiment, Mo-containing layer 31 is a Mo nitride such as MoN, $Mo_2N$ or random combinations of molybdenum nitrides or various amorphous non-stoichiometric molybdenum nitride materials.

In yet another embodiment, Mo-containing layer 31 includes two or more of the aforementioned films, i.e. two or more of films of various molybdenum oxides, molybdenum nitrides, and pure molybdenum disposed over one another. Thickness 35 of Mo-containing layer 31 is about 10 nm in one embodiment. In other embodiments, thickness 35 ranges from about 5 to about 100 nm, but in other embodiments, other thicknesses are used for thickness 35. Interface 33 is a clearly observable interface between two distinct layers. Applicants attribute the formation of distinctive interface 33 to the separate deposition processes used to form Mo layer 25 and Mo-containing layer 31.

Still referring to FIG. 2C, in various embodiments, Mo layer 25 serves as a back electrode for a solar cell to be formed over and including the structure of FIG. 2C. Mo-containing layer 31 will be converted to an $MoSe_2$ or other molybdenum selenide layer that provides ohmic contact between Mo layer 25 and an absorber layer or other solar cell layers that are formed over Mo-containing layer 31. Due to the presence of interface 33, the thickness of the $MoSe_2$ layer or other molybdenum selenide layer formed from Mo-containing layer 25 is well controlled.

A selenization process is carried out upon the structure shown in FIG. 2C to form the structure shown in FIG. 2D. The selenization process converts Mo-containing layer 31 to a molybdenum selenide layer. Molybdenum selenide layer 37 is formed by adding selenium to Mo-containing layer 31. In some embodiments, molybdenum selenide layer 37 is $MoSe_2$ and in other embodiments, non-stoichiometric molybdenum-selenium materials are formed. The selenization process selectively converts Mo-containing layer 31 to molybdenum selenide layer 37 but does not convert any Mo beneath interface 33, to molybdenum selenide. Stated alternatively, Mo layer 25 is not converted to molybdenum selenide.

In some embodiments, the selenization process is carried out in the furnace with $H_2Se$ in gas phase and the heating operation takes place at a temperature within a range of 350° C. to about 600° C. but other temperatures and other sources of selenium are used in other embodiments. In some embodiments, a selenium source material is dissociated to form selenium radicals and in other embodiments, other selenium source materials are thermally evaporated to form various selenium-containing vapors. The time for selenization ranges from 4-12 hours in some embodiments but other times are used in various embodiments. Regardless of the conditions used and the presence or absence of additives such as oxygen and nitrogen in Mo-containing layer 31, it has been found that selenization does not affect Mo layer 25 but selectively converts only Mo-containing layer 31 to molybdenum selenide layer 37. In some embodiments, correlations between thickness 35 of Mo-containing layer 31 and thickness 39 of molybdenum selenide layer 37 are established. According to one such correlation, when thickness 35 of Mo-containing layer 31 ranges from about 5-20 nm, molybdenum selenide layer 37 is produced to include thickness 39 of about 10-40 nm, but other mathematical correlations are established in other embodiments.

In various embodiments, thickness 39 of molybdenum selenide layer 37 ranges from about 10 to 100 nm and thickness 39 is determined by thickness 35 of Mo-containing layer 31 as above. In one particularly advantageous embodiment, thickness 39 is controlled to be about 20 nm but other thicknesses are used in other embodiments. In many embodiments, thickness 39 is much less than thickness 29 of Mo layer 25 which ranges from about 150 nm to greater than 1000 nm in various embodiments.

FIG. 2E shows absorber layer 41 formed over molybdenum selenide layer 37. Absorber layer 41 is a CIGS (Cu(In, Ga)Se$_2$) absorber layer in one embodiment, but other absorber layers are used in other embodiments. According to embodiments in which molybdenum selenide layer 37 is a stoichiometric MoSe$_2$ layer, the CIGS absorber layer 41 tends toward complete chalcopyrite formation, i.e. towards complete crystallinity. This is due to the effect of the MoSe$_2$ upon absorber layer 41 and, in particular, at interface 43. Various deposition and formation methods are available and are used to form absorber layer 41.

In some embodiments, a sulfurization process is carried out upon the CIGS absorbent layer 41, in which H$_2$S gas is used. The presence of sulfur, S, produces a higher band gap and lattice distortion by replacing Se with S in some locations in CIGS absorber layer 41. The presence of S can also fill Se vacancies in the CIGS layer and convert Cu$_{2-x}$Se to a lower conductive phase material of Cu$_{2-x}$S. In other embodiments, the sulfurization process is not used.

Various other films are suitably formed over absorber layer 41 using various methods, to complete the solar cell structure. Material 45 is formed over top surface 47 of absorber layer 41. Material 45 includes a window layer such as ZnO that allows sunlight to pass therethrough and become absorbed in absorber layer 41, in some embodiments. In some embodiments, material 45 includes a CdS buffer layer disposed between the window layer and the absorber layer. In other embodiments, material 45 includes various other material layers and films used to complete the solar cell.

According to one aspect of the disclosure, a solar cell is provided. The solar cell comprises a substrate, a Mo material disposed over the substrate, a Mo—Se layer disposed over the Mo material with an interface interposed between the Mo material and the Mo—Se layer, and an absorber layer disposed over the Mo—Se layer.

According to another aspect, a method for forming a solar cell is provided. The method comprises providing a substrate with a Mo layer thereon; depositing a Mo-containing layer over the Mo layer; and selenizing the Mo-containing layer by heating in a selenium environment thereby selectively producing a Mo—Se layer from the Mo-containing layer but not from the Mo layer.

According to another aspect, a method for forming a solar cell is provided. The method comprises providing a substrate; forming a Mo layer over the substrate using a Mo deposition operation; terminating the Mo deposition operation; forming a Mo-containing layer over the Mo layer; and carrying out a selenization process that converts the Mo-containing layer to Mo—Se but does not convert the Mo layer to Mo—Se. In some embodiments, the method further comprises forming a molybdenum oxide layer or a molybdenum nitride layer between the Mo layer and the Mo-containing layer.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for forming a solar cell, said method comprising:
    forming a layer exclusively of molybdenum (Mo) on a substrate using a Mo deposition operation using a first target in a chamber, but not a second target in the chamber;
    terminating said Mo deposition operation;
    forming a Mo-containing layer including at least oxygen therein on said Mo layer using the second target in said chamber but not the first target;
    selenizing said Mo-containing layer by heating in a selenium (Se) environment including gaseous H$_2$Se thereby selectively producing a Mo—Se layer from said Mo-containing layer but not from said Mo layer, said selenizing process including heating in the presence of gaseous H$_2$Se; and
    after said Mo—Se layer is formed, initiating a step of forming an absorber layer over said Mo—Se layer after said selenizing process is completed, wherein said absorber layer does not change said Mo—Se layer.

2. The method as in claim 1, wherein said providing a substrate with a Mo layer thereon includes sputtering said Mo layer in a sputter deposition chamber and wherein said forming a Mo-containing layer comprises sputtering said Mo-containing layer.

3. The method as in claim 1, wherein said absorber layer is a copper-indium-gallium-selenide (CIGS) absorber layer.

4. The method as in claim 3, wherein said forming a Mo-containing layer comprises sputtering and further comprising forming a buffer layer over said CIGS absorber layer and forming a window layer over said buffer layer.

5. The method as in claim 3, further comprising carrying out a sulfurization process after depositing said CIGS absorber layer.

6. A method for forming a solar cell, said method comprising:
    providing a substrate;

forming a layer exclusively of Mo on said substrate using a Mo deposition operation using a first target in a chamber, but not a second target in the chamber;

terminating said Mo deposition operation;

forming a Mo-containing layer including at least one of oxygen and nitrogen therein over said Mo layer using the second target in said chamber but not the first target;

carrying out a selenization process that converts said Mo-containing layer to Mo—Se but does not convert said Mo layer to Mo—Se, said selenization process including heating in the presence of gaseous $H_2Se$; and after said Mo—Se layer is formed, initiating a step of forming a CIGS absorber layer over said Mo—Se layer after said selenization process is completed, wherein said CIGS absorber layer does not change said Mo—Se layer.

7. The method as in claim 6, wherein said terminating comprises waiting at least one second prior to said forming a Mo-containing layer over said Mo layer.

8. The method as in claim 6, wherein said Mo deposition operation takes place in a deposition chamber using a first Mo source target, said terminating includes switching to a second Mo source target in said deposition chamber and said forming said Mo-containing layer includes depositing said Mo-containing layer using said second Mo source target.

9. The method as in claim 6, wherein said forming a Mo layer over said substrate includes forming said Mo layer over at least one of a silicon dioxide layer and a barrier layer interposed between said substrate and said Mo layer and wherein said Mo—Se is a layer with a thickness of about 10 nm to about 40 nm.

10. The method as in claim 6, wherein said selenization process includes heating to a temperature within a range of about 350° C. to 600° C. for a time within the range of about 8-12 hours.

11. A method for forming a solar cell, said method comprising:

forming a Mo layer exclusively of Mo on a substrate using a first target in a chamber, but not a second target in the chamber;

forming a Mo-containing layer including at least oxygen therein, over said Mo layer using the second target in said chamber but not the first target;

carrying out a selenization process that converts said Mo-containing layer to a Mo—Se layer but does not convert said Mo layer to Mo—Se, said selenization process including heating in the presence of gaseous $H_2Se$; and after said Mo—Se layer is formed, initiating a step of forming an absorber layer over said Mo—Se layer after said selenization process is completed, wherein said absorber layer does not change said Mo—Se layer.

12. The method as in claim 11, wherein said Mo-containing layer is a composite layer including a plurality of films including a film of a molybdenum oxide and a film of a molybdenum nitride.

13. The method as in claim 11, further comprising carrying out a sulfurization process simultaneous with said carrying out a selenization process.

14. The method as in claim 11, wherein said forming an absorber layer comprises depositing a CIGS absorber layer.

15. The method as in claim 14, further comprising carrying out a sulfurization process after said depositing a CIGS absorber layer.

16. The method as in claim 11, wherein said forming a Mo layer and said forming a Mo-containing layer each comprise sputtering.

* * * * *